(12) United States Patent
Flachowsky et al.

(10) Patent No.: US 9,449,972 B1
(45) Date of Patent: Sep. 20, 2016

(54) FERROELECTRIC FINFET

(71) Applicant: GLOBALFOUNDRIES Inc., Grand Cayman (KY)

(72) Inventors: Stefan Flachowsky, Dresden (DE); Ralf Illgen, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/640,151

(22) Filed: Mar. 6, 2015

(51) Int. Cl.
*H01L 29/51* (2006.01)
*H01L 21/8234* (2006.01)
*H01L 29/66* (2006.01)
*H01L 21/28* (2006.01)
*H01L 27/088* (2006.01)
*H01L 29/423* (2006.01)
*H01L 27/11* (2006.01)
*H01L 21/311* (2006.01)
*H01L 21/3065* (2006.01)

(52) U.S. Cl.
CPC ..... *H01L 27/0886* (2013.01); *H01L 21/28291* (2013.01); *H01L 21/31111* (2013.01); *H01L 21/823431* (2013.01); *H01L 21/823462* (2013.01); *H01L 27/1104* (2013.01); *H01L 29/42364* (2013.01); *H01L 29/511* (2013.01); *H01L 29/516* (2013.01); *H01L 29/517* (2013.01); *H01L 29/518* (2013.01); *H01L 29/6684* (2013.01); *H01L 21/3065* (2013.01)

(58) Field of Classification Search
CPC ............... H01L 27/11585; H01L 21/28291; H01L 29/516; H01L 29/6684; H01L 29/78391; H01L 2924/1441
See application file for complete search history.

(56) References Cited

U.S. PATENT DOCUMENTS

| | | | |
|---|---|---|---|
| 2009/0078997 A1* | 3/2009 | Greene | H01L 21/82380 257/347 |
| 2009/0261395 A1* | 10/2009 | Boescke | G11C 11/22 257/295 |
| 2015/0079750 A1* | 3/2015 | Wang | H01L 29/66803 438/283 |

* cited by examiner

*Primary Examiner* — Kevin Parendo
(74) *Attorney, Agent, or Firm* — Amerson Law Firm, PLLC

(57) ABSTRACT

The present disclosure provides, in a first aspect, a semiconductor device, including a semiconductor substrate and a gate structure formed over the semiconductor substrate, wherein the gate structure comprises a fin and a ferroelectric high-k material formed at least over sidewall surfaces of the fin. Herein, a first thickness defined by a thickness of the ferroelectric high-k material formed over sidewalls of the fin is substantially greater than a second thickness defined by a thickness of the ferroelectric high-k material formed over an upper surface of the fin.

16 Claims, 3 Drawing Sheets

FERROELECTRIC FINFET

BACKGROUND OF THE INVENTION

1. Field of the Invention

The present disclosure relates to a semiconductor device, a semiconductor device structure, a method of forming a semiconductor device and a method of forming a semiconductor device structure. Particularly, the present disclosure relates to FinFET device structures having gate structures with ferroelectric high-k materials and non-ferroelectric high-k materials.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 μm, the more so as current semiconductor technologies are apt of producing structures with dimensions in the magnitude of 100 nm or less. With ICs representing a set of electronic circuit elements integrated on a semiconductor material, normally silicon, ICs may be made much smaller than any discreet circuit composed of separate independent circuit components. Indeed, the majority of present-day ICs are implemented by using a plurality of circuit elements, such as field effect transistors (FETs), also called metal oxide semiconductor field effect transistors or MOSFETs, occasionally also simply referred to as MOS transistors, and passive elements, such as resistors, e.g., diffusion resistors, and capacitors, integrated on a semiconductor substrate within a given surface area. Typical present-day ICs involve millions of single circuit elements formed on a semiconductor substrate.

The basic function of a MOSFET is that of an electronic switching element, controlling a current through a channel region provided between two junction regions which are referred to as source and drain. The control of the conductivity state of the channel region is achieved by means of a gate electrode being disposed over the channel region and to which gate electrode a voltage relative to source and drain is applied. In common planar MOSFETs, the channel region extends in a plane between source and drain. Generally, in applying a voltage exceeding a characteristic voltage level to the gate electrode, the conductivity state of the channel is changed and switching between a conducting state or "ON-state" and a non-conducting state or "OFF-state" may be achieved. It is important to note that the characteristic voltage level at which the conductivity state changes (usually called the "threshold voltage"), therefore, characterizes the switching behavior of the MOSFET, and it is generally an issue to keep variations in the threshold voltage level low when implementing a desired switching characteristic. However, with the threshold voltage depending nontrivially on the transistor's properties, e.g., materials, dimensions, etc., the implementation of a desired threshold voltage value during fabrication processes involves careful adjustment and fine tuning during the fabrication processes, which makes the fabrication of complex semiconductor devices by advanced technologies more and more difficult.

In general, it was observed that, with the sizes of individual MOSFETs having steadily decreased over the last decades, strongly scaled MOSFETs suffered more and more from undesirable effects once the length of the channel of a MOSFET entered the same order of magnitude as the width of the depletion layer of source and drain. For strongly scaled MOSFETs, for example, the OFF-state leakage current (i.e., the leakage current in the OFF-state) increased with the idle power required by the device. Accordingly, these deteriorating effects, which appear at small scales and are associated with a short channel length, are frequently referred to as so-called "short channel effects." In order to continue to lower scales, tremendous efforts are needed to address the issues or marginalities, variabilities and challenges appearing in scaling towards VLSI (very large scale integration) MOSFET technologies at, for instance, 20 nm or less, such that all the marginalities in each individual process step and all variabilities are properly addressed and, at best, reduced.

In the efforts of overcoming the above-described issues encountered when reaching smaller and smaller scales, multi-gate MOSFET devices have been proposed. A kind of multi-gate MOSFET device used for advanced 22/14 nm technologies is realized as a so-called "FinFET." In general, FinFETs represent three-dimensional transistors formed by thin fins extending upwardly from a semiconductor substrate, where particularly the transistor channel is three-dimensional. For example, in some designs of FinFET devices, the channel is formed along the vertical sidewalls of the fin (which is also referred to as a "double-gate transistor") or along the vertical sidewall surfaces and the upper horizontal surface of the fin (leading to so-called "tri-gate transistors"). Double-gate transistors and tri-gate transistors have wide channels and, on the other hand, high performance, which may be achieved without substantially increasing the area of the substrate surface required by these transistors because a transistor's performance, being measured by its transconductance, is proportional to the width of the transistor channel. Therefore, by the multi-gate configuration as provided by the three-dimensional channel of FinFETs, these semiconductor devices allow for a better control of the channel region when compared to common planar transistor devices.

Furthermore, due to the various efforts that were carried out to improve memory arrays, ferroelectric gate field effect transistors (FeFETs) have been recently in the focus of research. In general, ferroelectric materials have dielectric crystals which show a spontaneous electric polarization similar to ferromagnetic materials having a spontaneous magnetization. Upon applying an appropriate external electric field to a ferroelectric material, the direction of polarization of the ferroelectric material may be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically switchable data storage devices.

On the basis of ferroelectric materials, it is possible to provide non-volatile memory devices, particularly random excess memory devices similar in construction to DRAM devices, but differing in that a ferroelectric layer is used instead of a dielectric layer such that a non-volatile memory device is obtained. For example, the 1T-1C storage cell design in a FeRAM is similar in construction to the storage cell in widely used DRAM in that both cell types include one capacitor and one excess transistor—a linear dielectric is used in a DRAM cell capacitor, whereas in a FeRAM cell capacitor the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on or off state, depending on the orientation of the electric polarization state of the ferroelectric dielectric. Writing on a FeFET is achieved in applying a writing voltage to the gate relative to source, while a 1T-FeRAM is read out by measuring the current when applying a reading voltage to source and drain. It is noted that reading out of a 1T-FeRAM is nondestructive.

Although a FeFET or a ferroelectric capacitor represent in theory very promising concepts for complex semiconductor devices, it is a difficult task to identify appropriate ferroelectric materials which are compatible with existing advanced manufacturing processes of complex devices, particularly at very small scales. For example, commonly known ferroelectric materials, such as PZT or perovskites, are not compatible with standard CMOS processes. According to present understanding, hafnium (Hf) based materials, which are used in current fabrication technologies, exhibit a para-electric behavior due to the predominantly monoclinic crystal structure present in hafnium oxide. However, recent research results indicate that dielectric materials on the basis of hafnium oxide may represent promising candidates for materials with ferroelectric behavior to be used in the fabrication of ferroelectric semiconductor devices. It is, for example, known that the monoclinic structure may be suppressed in hafnium oxide materials doped with Zr, Si, Y or Al, wherein the crystal structures of ferroelectric nature may be stabilized.

In embedding FeFETs together with standard MOSFETs into existing process flows according to advanced CMOS techniques, ferroelectric semiconductor devices and non-ferroelectric semiconductor devices having different gate stack heights due to the height difference between the ferroelectric gate dielectric and the non-ferroelectric gate dielectric are formed. Especially in FinFET integration schemes, strong topographical differences appear after the gate formation between FeFET and MOSFET devices, causing problems in replacement gate processes, particularly at chemical mechanical polishing (CMP) steps.

It is, therefore, desirable to provide a semiconductor device that does not increase topography differences due to a ferroelectric gate dielectric. It is further desirable to provide a method of forming an according semiconductor device. Furthermore, it is desirable to provide a semiconductor device structure having ferroelectric and non-ferroelectric semiconductor devices which do not show strong topography variations. It is further desirable to provide a method of forming an according semiconductor device structure.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a semiconductor device is provided. In some illustrative embodiments herein, the semiconductor device includes a semiconductor substrate and a gate structure formed over the semiconductor substrate, wherein the gate structure comprises a fin and a ferroelectric high-k material formed at least over sidewall surfaces of the fin. A first thickness defined by a thickness of the ferroelectric high-k material formed over sidewalls of the fin is substantially greater than a second thickness defined by a thickness of the ferroelectric high-k material formed over an upper surface of the fin.

In a second aspect of the present disclosure, a semiconductor device structure is provided. In accordance with illustrative embodiments herein, the semiconductor device structure includes a semiconductor substrate, a first semiconductor device with a first gate structure formed over a first region of the semiconductor substrate, the gate structure comprising a first fin, a ferroelectric high-k material formed at least on sidewall surfaces of the first fin and a first non-ferroelectric high-k material formed on the ferroelectric high-k material, and a second semiconductor device with a second gate structure formed over a second region of the semiconductor substrate, the second gate structure comprising a second fin and a second non-ferroelectric high-k material formed on the second fin. Herein, the first and second gate structures are all substantially of equal height relative to the semiconductor substrate.

In a third aspect of the present disclosure, a method of forming a semiconductor device is provided. In accordance with illustrative embodiments herein, the method includes forming a fin over a semiconductor substrate, forming a ferroelectric high-k material over the fin, anisotropically etching the ferroelectric high-k material and depositing a non-ferroelectric high-k material over the etched ferroelectric high-k material.

In a fourth aspect of the present disclosure, a method of forming a semiconductor device structure is provided. In accordance with illustrative embodiments herein, the method includes forming at least one first fin over a first region of a semiconductor substrate, forming at least one second fin over a second region of the semiconductor substrate, forming a ferroelectric high-k material over the at least one first fin, anisotropically etching the ferroelectric high-k material, and depositing a non-ferroelectric high-k material over the first and second regions, wherein the non-ferroelectric high-k material is formed over the ferroelectric high-k material over the at least one first fin and over the at least one second fin.

BRIEF DESCRIPTION OF THE DRAWINGS

The disclosure may be understood by reference to the following description taken in conjunction with the accompanying drawings, in which like reference numerals identify like elements, and in which.

Figure 1A:
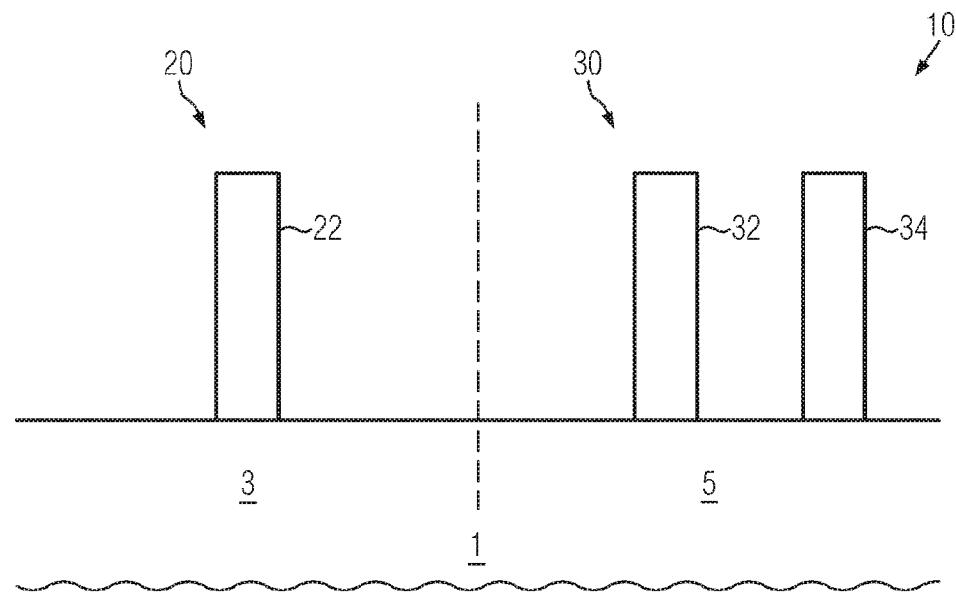
FIGS. 1a-1f schematically illustrate in cross-sectional views a semiconductor device structure in accordance with some illustrative embodiments of the present disclosure at various stages during fabrication.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example, smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length dimensions and/or width dimensions smaller than 100 nm, for example, smaller than 50 nm or smaller than 35 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

As described above, the first aspects of the present disclosure provides a semiconductor device having a semiconductor substrate and a gate structure formed over the semiconductor substrate, the gate structure comprising a fin and a ferroelectric high-k material formed at least over sidewall surfaces of the fin. Herein, a first thickness defined by a thickness of the ferroelectric high-k material formed over sidewalls of the fin is substantially greater than a second thickness defined by a thickness of the ferroelectric high-k material formed over an upper surface of the fin. The accordingly provided semiconductor device allows reducing variations in the topography caused by an additional layer of ferroelectric high-k material disposed on an upper surface of the fin by forming the ferroelectric high-k material having a first thickness over sidewalls of the fin and a second thickness over the upper surface of the fin, wherein the second thickness is smaller than the first thickness.

In accordance with some illustrative embodiments of the first aspect, the second thickness may be substantially zero and the ferroelectric high-k material may be only formed over sidewall surfaces of the fin. Herein, non-ferroelectric high-k material may be formed directly on the upper surface of the fin. In accordance with some examples herein, the semiconductor device may further comprise a non-ferroelectric high-k material formed on the ferroelectric high-k material and the upper surface. The height of the fin together with the non-ferroelectric high-k material may not depend on the ferroelectric high-k material. In accordance with some special examples herein, a thickness of the non-ferroelectric high-k material may be substantially smaller than the first thickness. In accordance with other examples herein, the semiconductor device may further comprise a silicon oxide material formed on the upper surface of the fin. In some special examples herein, a thickness of silicon oxide material may be substantially smaller than the first thickness.

In accordance with some illustrative embodiments of the first aspect, the semiconductor device may further comprise a non-ferroelectric high-k material of a third thickness formed on the ferroelectric high-k material, the third thickness and the second thickness being together at most of about the first thickness.

In accordance with some illustrative embodiments of the first aspect, the ferroelectric high-k material may be formed by a ferroelectric hafnium oxide material. In some illustrative examples herein, the semiconductor device may further comprise a TiN material layer formed on the ferroelectric hafnium oxide material and a non-ferroelectric high-k material formed on the TiN material layer.

As described above, the second aspect of the present disclosure provides a semiconductor device structure, comprising a semiconductor substrate, a first semiconductor device with a first gate structure formed over a first region of the semiconductor substrate, the gate structure comprising a first fin, a ferroelectric high-k material formed at least on sidewall surfaces of the first fin and a first non-ferroelectric high-k material formed on the ferroelectric high-k material, and a second semiconductor device with a second gate structure formed over a second region of the semiconductor substrate, the second gate structure comprising a second fin and a second non-ferroelectric high-k material formed on the second fin, wherein the first and second gate structures are of substantially equal height relative to the semiconductor substrate.

In accordance with some illustrative embodiments of the second aspect, the first semiconductor devices represent storage devices, e.g., FeRAM devices, and the second semiconductor devices may represent at least one of logic devices and SRAM devices of an integrated circuit structure to be formed over the semiconductor substrate.

In accordance with some illustrative embodiments of the second aspect, the first and second non-ferroelectric high-k materials may be substantially equal.

In accordance with some illustrative embodiments of the second aspect, the non-ferroelectric high-k material may be formed on an upper surface of the first fin.

In accordance with some illustrative embodiments of the second aspect, the semiconductor device structure may further comprise a third gate structure formed over the first region and a fourth gate structure formed over the second region, wherein a separation between the first and third gate structures is substantially smaller than a separation between the second and fourth gate structures.

As described above, the third aspect of the present disclosure provides a method of forming a semiconductor device, the method comprising forming a fin over a semiconductor substrate, forming a ferroelectric high-k material over the fin, anisotropically etching the ferroelectric high-k material, and depositing a non-ferroelectric high-k material over the etched ferroelectric high-k material.

In accordance with some illustrative embodiments of the third aspect, the anisotropically etching may comprise a reactive ion etching (RIE) step.

In accordance with some illustrative embodiments of the third aspect, the ferroelectric high-k material may be removed from an upper surface of the fin during the anisotropically etching so as to expose the upper surface.

In a fourth aspect of the present disclosure, a method of forming a semiconductor device structure is provided, the method comprising forming at least one first fin over a first region of a semiconductor substrate, forming at least one second fin over a second region of the semiconductor substrate, forming a ferroelectric high-k material over the at least one first fin, anisotropically etching the ferroelectric high-k material, and depositing a non-ferroelectric high-k material over the first and second regions, wherein the non-ferroelectric high-k material is formed over the ferroelectric high-k material over the at least one first fin and on the at least one second fin.

In accordance with some illustrative embodiments of the fourth aspect, the method may further comprise forming a mask pattern over the first and second regions, the mask pattern covering the second region before the ferroelectric high-k material is formed over the at least one first fin.

In accordance with some illustrative embodiments of the fourth aspect, a plurality of first fins and a plurality of second fins may be formed, the first fins having a greater pitch than the second fins.

FIG. 1a schematically illustrates, in a cross-sectional view, a semiconductor device structure 10 formed in and over a semiconductor substrate 1. The semiconductor substrate 1 may be a semiconductor bulk substrate or a semiconductor-on-insulator (SOI) substrate or a silicon/germanium-on-insulator (SGOT) substrate. In general, the terms "substrate," "semiconductor substrate" or "semiconducting substrate" should be understood as to cover all semiconductor materials, in all forms of such semiconductor materials, and no limitation to a special kind of substrate is intended. The person skilled in the art will appreciate that, in some illustrative embodiments, the substrate may represent an SOI substrate configuration including a thin silicon film (not illustrated) disposed on a buried oxide or BOX layer (not illustrated), which in turn is formed on a substrate base or base wafer (not illustrated). Herein, the upper portion of the SOI substrate as schematically illustrated in FIG. 1a may, for example, correspond to the thin silicon film.

Referring to FIG. 1a, the semiconductor device structure 10 comprises a semiconductor device 20 and a semiconductor device 30. The semiconductor device 20 is formed in and over a region 3 of the semiconductor substrate 1, while the semiconductor device 30 is formed in and over a region 5 of the semiconductor substrate 1. The region 3 and the region 5 represent portions of the semiconductor substrate 1 which may be, in accordance with some illustrative embodiments herein, doped with a certain dopant in order to form a pre-doped well, such as a P-well or an N-well. Additionally or alternatively, the regions 3 and 5 may represent surface regions of the semiconductor substrate 1 which are located adjacent to each other, optionally separated by an insulating structure, such as a shallow trench isolation (STI, not illustrated). This does not pose any limitation to the present disclosure and the person skilled in the art will appreciate that the regions 3 and 5 may be separated by one or more device regions (not illustrated) formed in between. The semiconductor device 20 has a fin 22 formed on and extending away from an upper surface of the region 3. The semiconductor device 30 has a fin 32 and a fin 34 formed on and extending away from an upper surface of the region 5. In accordance with some illustrative embodiments of the present disclosure, the region 3 may represent a region in and on which one or more storage devices, e.g., one or more FeRAM devices, are to be formed. Additionally or alternatively, the region 5 may represent a region in and over which one or more logic devices and/or SRAM devices are to be formed.

Below, some illustrative embodiments of the present disclosure will be described in greater detail and with regard to the enclosed figures, wherein a ferroelectric FinFET is formed.

Figure 1B:
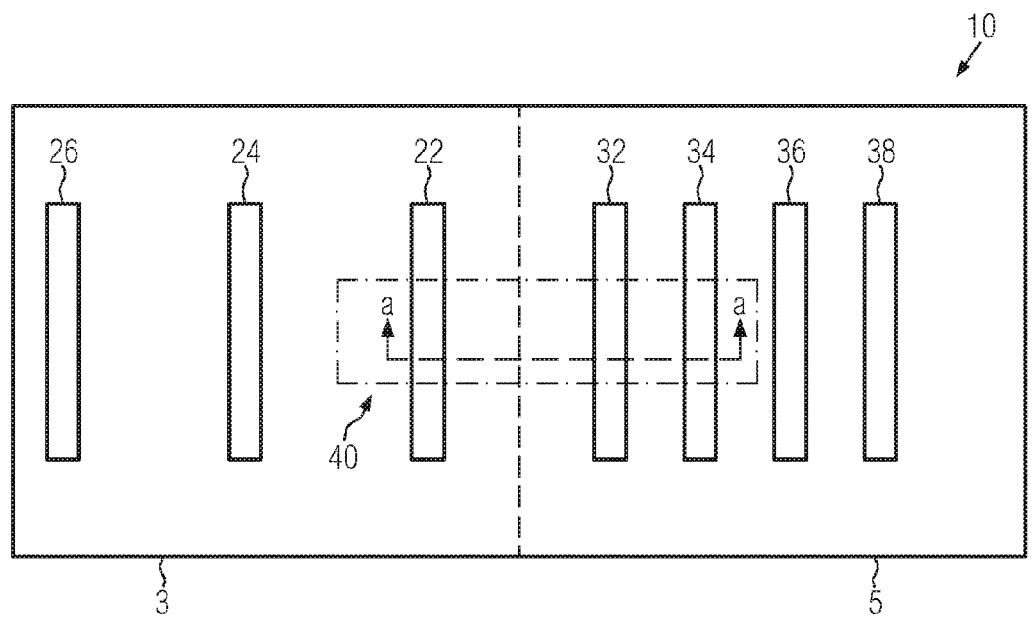

FIG. 1b schematically shows a top view of a portion of the upper surface of the semiconductor substrate 1 schematically illustrating the regions 3 and 5. As it is visible from FIG. 1b, the fin 22 may be part of a plurality of fins 22, 24, 26 formed in the region 3, while the fins 32, 34 may be part of a plurality of fins 32, 34, 36 and 38 in the region 5. The crosssection as illustrated in FIG. 1a is schematically indicated by line a-a in FIG. 1b.

Referring back to FIG. 1a, the semiconductor devices 20, 30 may be formed in accordance with known techniques for forming fins in at an upper surface of a semiconductor substrate, such as by patterning a trench structure on an upper surface of a semiconductor substrate, etching trenches in accordance with the trench structure into the upper surface of the semiconductor substrate and, optionally, filling the trenches by an insulating material for adjusting an effective height of fins which are delimitated by the trenches.

With regard to the semiconductor device structure 10 as depicted in FIG. 1a, the person skilled in the art will appreciate that a masking pattern (not illustrated) used for patterning the semiconductor devices 20, 30 may be formed by two mask pattern portions for successively patterning in each region a fin structure corresponding to the plurality of fins 22, 24 and 26 in region 3 and the plurality of fins 32, 34, 36 and 38 in region 5. The person skilled in the art will appreciate that a pitch corresponding to the semiconductor device 20 may differ from the pitch of the semiconductor device 30. In accordance with some illustrative examples herein, the pitch of the semiconductor device 20 may be greater than the pitch of the semiconductor device 30 such that a distance between neighboring fins of the semiconductor device 20 may be 1.5 times a separation of neighboring fins of the semiconductor device 30 or more.

Next, a mask structure 40 for patterning a gate electrode may be formed, as it is illustrated in FIG. 1b. The mask structure 40 partially covers the region 3 and/or the region 5, such that a gate structure (not illustrated) may be formed over at least one of the fins of the semiconductor device 20 and/or at least one of the fins of the semiconductor device 30.

With regard to FIG. 1b, an illustrative embodiment of the present disclosure is schematically depicted, wherein the mask structure 40 extends transversely to the fins 22, 32 and 34, and partially exposes each of the fins 22, 32 and 34.

Figure 1C:
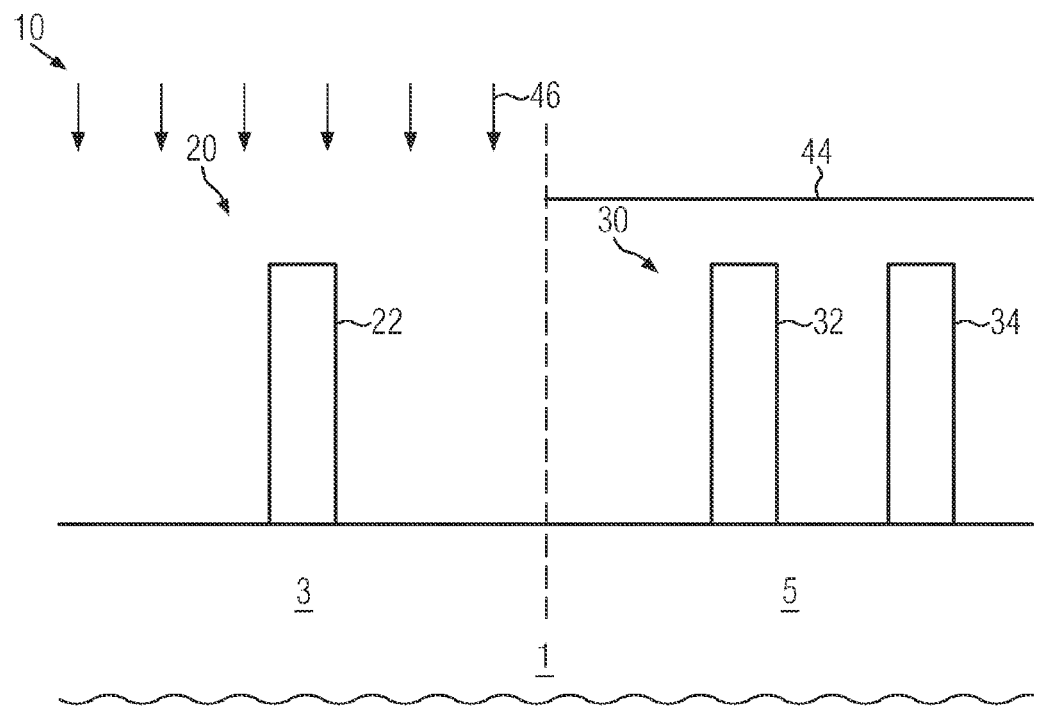

Referring to FIG. 1c, the semiconductor device structure 10 is schematically illustrated at a more advanced stage during fabrication, after a further masking pattern 44 is formed over the semiconductor substrate 10 such that the portion of the semiconductor device 20 being exposed by the mask pattern 40 remains at least partially exposed, while the semiconductor device 30 is covered. The person skilled in the art will appreciate that at least a portion of the fin 22 of the semiconductor device 20 is exposed by the mask pattern 40 and the mask structure 44, while the semiconductor device 30 and, particularly, the fins 32 and 34 are covered. Next, as illustrated in FIG. 1c, a process 46 is performed for forming a ferroelectric material layer 24 (see FIG. 1d) over the region 3, which is over the fin 22.

In accordance with some illustrative embodiments herein, the ferroelectric material layer 24 may be formed by depositing a ferroelectric material over the region 3. For example, the ferroelectric material may be formed by a ferroelectric hafnium oxide material. The person skilled in the art will appreciate that a cap layer (not illustrated), e.g. formed by TiN, may be formed on the ferroelectric material such that a ferroelectric phase of the ferroelectric material is stabilized during further processing. In accordance with an illustrative example, the ferroelectric material layer 24 may be formed by depositing hafnium, optionally doped with one of Si and Y and Zr, being covered by a cap material, e.g. TiN, and exposed to an annealing step (not illustrated) for activating the ferroelectric phase. For example, a cap material (not illustrated) may be formed with a thickness of about 10 nm or less.

Figure 1D:
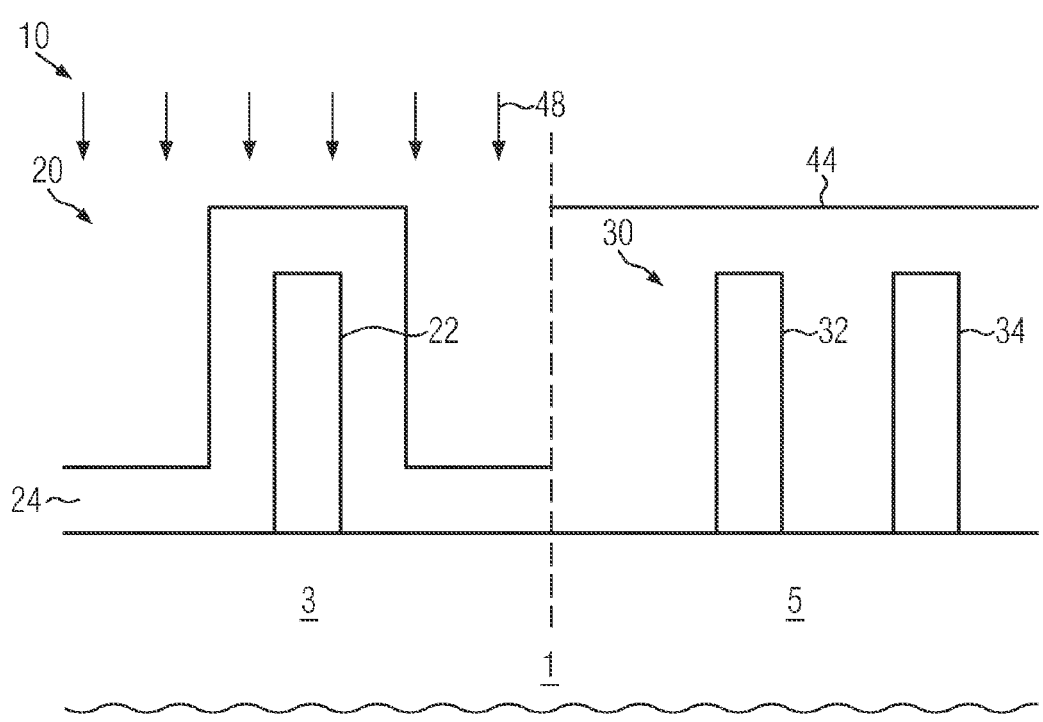

Referring to FIG. 1d, the semiconductor device structure 10 is schematically illustrated in a cross-sectional view at a more advanced stage during fabrication, in which a stage process 48 is performed. The process 48 comprises an anisotropic etching to which the semiconductor device 20 is exposed for anisotropically etching the ferroelectric material layer 24, e.g., an RIE process. The person skilled in the art will appreciate that the semiconductor device 30 is protected from the process 48 by the masking pattern 44.

Figure 1E:
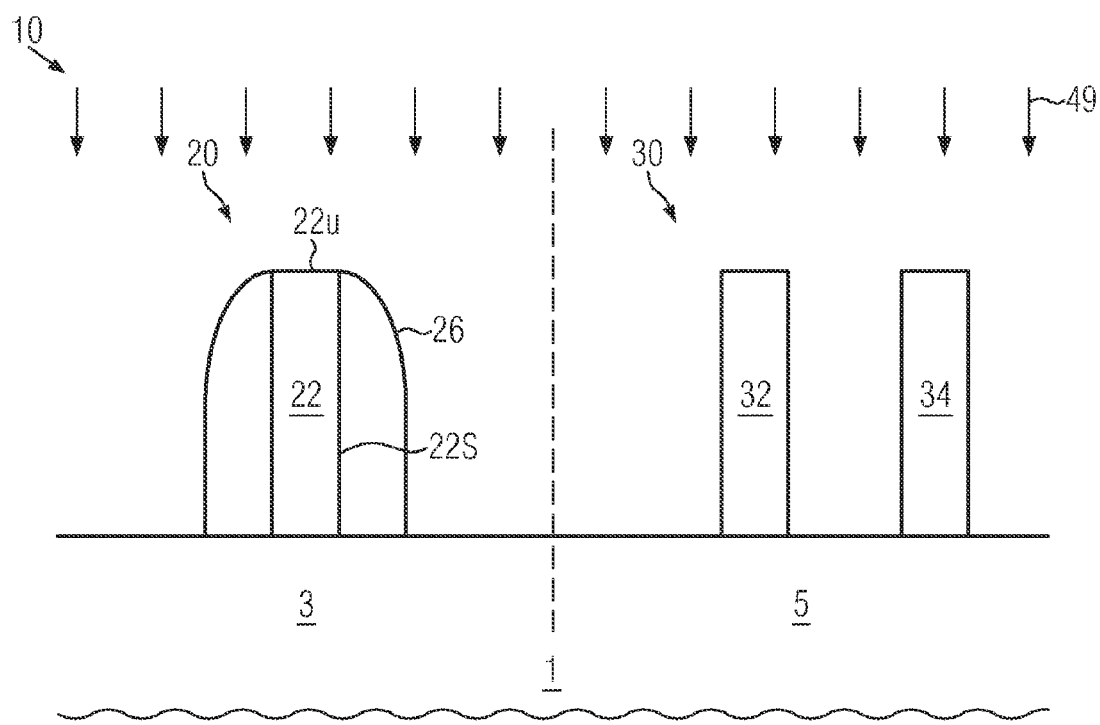

Referring to FIG. 1e, the semiconductor device structure 10 is schematically illustrated at a more advanced stage during fabrication, particularly after the process 48 is completed, the masking pattern 44 is removed and a process 49 is performed. The person skilled in the art will appreciate that after the process 48 is completed, the semiconductor device 20 as illustrated in FIG. 1e is obtained. Herein, the ferroelectric material layer 24 (see FIG. 1d) is anisotropically etched to result in the ferroelectric sidewall spacer 26 covering sidewalls 22s of the fin 22, while an upper surface 22u of the fin 22 is at least partially exposed.

Figure 1F:
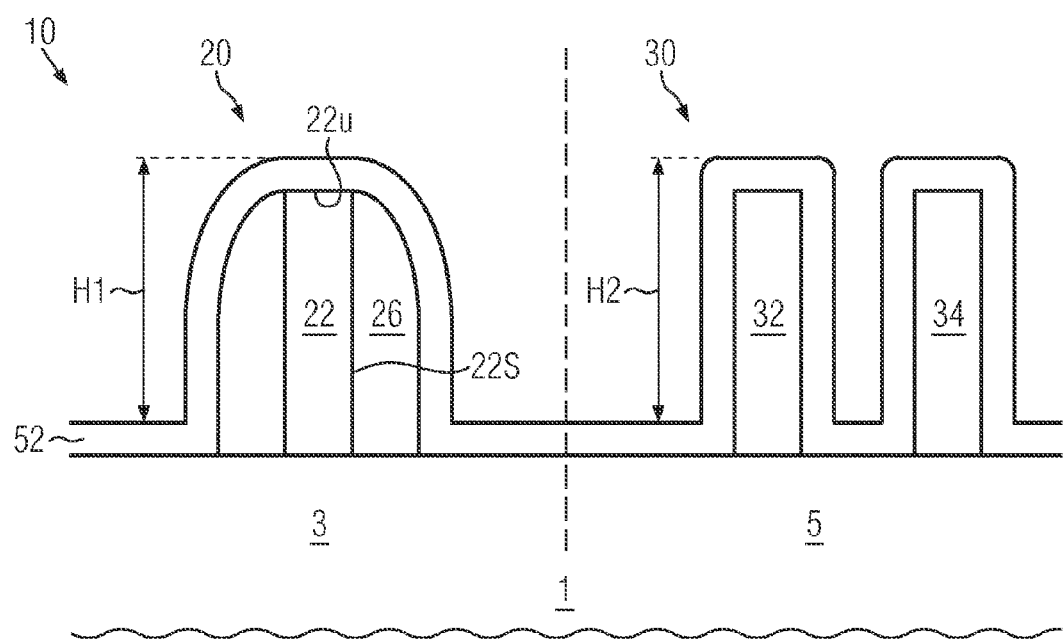

In accordance with some illustrative embodiments of the present disclosure, the process 49 comprises a deposition process for depositing a non-ferroelectric high-k material 52 over the regions 3 and 5 such that the semiconductor devices 20, 30 are covered by the non-ferroelectric high-k material 52, as illustrated in FIG. 1f. The person skilled in the art will appreciate that upon depositing the non-ferroelectric material over the fin 22 and the fins 32, 34, i.e. on the upper surface 22u of the fin 22, a height level H1 of the gate structure provided by the ferroelectric high-k spacer 26, the fin 22 and the non-ferroelectric high-k material 52 over the region 3 is substantially maintained equal to a height level H2 of gate structures formed by the fins 32, 34 and the non-ferroelectric high-k material 52. The expression "substantially equal" is to be understood as $H2 < 1.5 \times H1$, i.e., $H2 < 1.2 \times H1$ or $H2 < H1 \times 1.1$, e.g., $H2 < 1.05 \times H1$ or even $H2 < 1.01 \times H1$. Accordingly, the situation after formation of ferroelectric and non-ferroelectric high-k materials on the semiconductor devices 20, 30 does not lead to strong topographical differences between the semiconductor devices 20, 30, and, therefore, issues during subsequent CMP processes, e.g. at a subsequent RMG process, are avoided.

With regard to FIGS. 1a-1f, a process flow for fabricating a semiconductor device structure 10 is described in accordance with some illustrative embodiments of the present disclosure, where semiconductor devices 20, 30 having a tri-gate configuration are formed. This does not pose any limitation on the present disclosure and the person skilled in the art will appreciate that, in accordance with alternative embodiments, semiconductor devices having a double-gate configuration may be formed instead. In some illustrative examples herein, the process flow differs from the process as described with regard to the figures in that an additional step (not illustrated in the figures) of forming an insulating material, e.g., a silicon oxide material, on the upper surfaces of the fins is performed prior to the process 49 in FIG. 1e.

The person skilled in the art will appreciate that in accordance with some aspects of the present disclosure, shaped FeFETs for tri-gate integration are provided. The semiconductor devices of some aspects of the present disclosure may be incorporated in all FinFET technologies with embedded non-volatile memories, such as FeFETs. Opposed to conventional process flows in which FeFETs and standard CMOS devices are implemented at the same time and where different gate stack heights causing severe integration challenges are formed, it is proposed to build a FeFET with a ferroelectric layer not covering the entire fin, but only the sidewalls of the fin. Accordingly, a, for example, ten times thicker ferroelectric layer does not substantially increase the topography of a FeFET as compared to standard logic transistors, e.g., the semiconductor devices 30. As a result, the various methods of the present disclosure enable a much easier process integration without changing existing process steps.

In accordance with some explicit examples of the present disclosure, an illustrative method of forming a semiconductor device may start after conventional fin formation, either on bulk or SOI substrates (see FIG. 1a), by forming a mask pattern, e.g. by $Si_3N_4$, covering logic/SRAM areas, that is the non-ferroelectric device areas (e.g. the region 5 in FIG. 1c) may be formed. Next, a ferroelectric layer, for example having a thickness from about 5 nm to about 20 nm, and, for example comprising a hafnium oxide material with an optional doping by one of Al, Gd, Si, Y, Zr, La, etc., in order to modulate ferroelectric properties, may be deposited. The person skilled in the art will appreciate that, as the fin distance may be too small for such a thick layer, it might be necessary to use "double pitch" fins, in order to overcome potential intermediate space problems and to allow a conformal deposition of ferroelectric high-k material on both sides of the fin. Next, the ferroelectric layer may be anisotropically etched similar to conventional spacer formation techniques, e.g. by RIE, such that the top of the fin (i.e., the upper surface 22u), is at least partially exposed from the ferroelectric material (see semiconductor device 20 in FIG. 1e). After removing the mask structure covering the logical/SRAM areas, i.e. the region 5, a conventional high-k dielectric, e.g. hafnium oxide, and a metal gate may be deposited. In this way, a gate electrode covering channel regions provided by the fins 22, 32 and 34 may be formed and a controlled "switching" of the fins 22, 32 and 34 by a single gate contact is possible. The person skilled in the art will appreciate that the ferroelectric effect of the ferroelectric sidewall spacers 26 is herein inducing ferroelectric characteristic of the semiconductor device 20, wherein the ferroelectric characteristic increases with increasing aspect ratio. For example, for fins having an aspect ratio of 1:2 and more, e.g. 1:10, a sufficient ferroelectric characteristic may be achieved for the semiconductor device 20.

The person skilled in the art will appreciate that in accordance with some illustrative embodiments of the present disclosure, the resulting semiconductor device structure may have the same topography level as conventional process devices and, i.e., subsequent CMP steps are not affected by the presence of additional ferroelectric FinFETs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a fin over a semiconductor substrate, said fin comprising a semiconductor material;
    forming a ferroelectric high-k material over said fin;
    forming a cap layer on said ferroelectric high-k material;
    anisotropically etching said ferroelectric high-k material to remove said ferroelectric high-k material from an upper surface of said fin and expose said semiconductor material at said upper surface of said fin;
    depositing a non-ferroelectric high-k material over said etched ferroelectric high-k material and over said exposed semiconductor material at said upper surface of said fin; and
    activating a ferroelectric phase of said ferroelectric high-k material in the presence of said cap layer.

2. The method of claim 1, wherein anisotropically etching said ferroelectric high-k material comprises performing a reactive ion etching (ME) step.

3. The method of claim 1, wherein said cap layer comprises TiN.

4. The method of claim 1, wherein activating said ferroelectric phase of said ferroelectric high-k material comprises performing an annealing step.

5. The method of claim 1, wherein said ferroelectric high-k material comprises hafnium oxide.

6. The method of claim 1, wherein said non-ferroelectric high-k material is formed on and in direct contact with sidewall surfaces of said ferroelectric high-k material.

7. The method of claim 1, wherein said fin is a first fin formed over a first region of said semiconductor substrate, the method further comprising:
    forming a second fin over a second region of said semiconductor substrate;
    forming a patterned masking layer that covers said second fin and exposes said first fin, wherein said ferroelectric high-k material is formed over said exposed first fin and thereafter anisotropically etched while said second fin is covered by said patterned masking layer; and
    depositing said non-ferroelectric high-k material over said second fin and over said etched ferroelectric high-k material during a same deposition step.

8. The method of claim 7, further comprising removing said patterned masking layer prior to depositing said non-ferroelectric high-k material.

9. A method of forming a semiconductor device, the method comprising:
    forming a fin over a semiconductor substrate, said fin having an upper surface and sidewalls;
    forming a ferroelectric high-k material on said upper surface and said sidewalls of said fin;
    performing a reactive ion etching process on said ferroelectric high-k material so as to thereby expose a semiconductor material at said upper surface of said fin while leaving said ferroelectric high-k material positioned on said sidewalls of said fin;
    forming a TiN cap layer on and in contact with said ferroelectric high-k material positioned on said sidewalls of said fin; and
    after forming said TiN cap layer, depositing a non-ferroelectric high-k material around and above said fin and on and in contact with said TiN cap layer, said deposited non-ferroelectric high-k material covering said exposed semiconductor material at said upper surface of said fin and said ferroelectric high-k material positioned on said sidewalls of said fin.

10. The method of claim 9, wherein forming said ferroelectric high-k material comprises forming a ferroelectric hafnium oxide material.

11. The method of claim 9, wherein said ferroelectric high-k material is formed on and in direct contact with said semiconductor material at said upper surface of said fin.

12. A method of forming a semiconductor device, the method comprising:
    forming a fin over a semiconductor substrate, said fin having an upper surface and sidewalls;
    forming a ferroelectric high-k material comprising hafnium oxide on said upper surface and said sidewalls of said fin;
    performing a reactive ion etching process on said ferroelectric high-k material so as to thereby remove said ferroelectric high-k material from above the entire upper surface of said fin while leaving said ferroelectric high-k material positioned on said sidewalls of said fin;

forming a TiN cap layer on and in contact with said ferroelectric high-k material positioned on said sidewalls of said fin and on and in contact with said upper surface of said fin; and after performing said reactive ion etching process on said ferroelectric high-k material, depositing a non-ferroelectric high-k material around said fin and on and in contact with said TiN cap layer.

13. The method of claim 12, wherein said fin comprises a semiconductor material, and wherein said reactive ion etching process exposes said semiconductor material at said upper surface of said fin.

14. A method of forming a semiconductor device, the method comprising:

forming a first fin above a first region of a semiconductor substrate;

forming a second fin above a second region of said semiconductor substrate;

forming a patterned masking layer that covers said second fin and exposes said first fin;

forming a ferroelectric high-k material layer above said first region while said second fin is covered by said patterned masking layer, said ferroelectric high-k material layer completely covering sidewall and upper surfaces of said first fin;

performing an anisotropic etching process on said ferroelectric high-k material layer while said second fin is covered by said patterned masking layer so as to form a ferroelectric high-k sidewall spacer adjacent to said sidewall surfaces of said first fin and to expose a semiconductor material at said upper surface of said fin;

removing said patterned masking layer; and after performing said anisotropic etching process on said ferroelectric high-k material layer, depositing a non-ferroelectric high-k material layer above said first and second regions during a same deposition process, said deposited non-ferroelectric high-k material layer completely covering said second fin, said ferroelectric high-k sidewall spacer formed adjacent to said sidewall surfaces of said first fin, and said upper surface of said first fin.

15. The method of claim 14, wherein said non-ferroelectric high-k material layer is deposited on and in direct contact with said exposed semiconductor material at said upper surface of said fin.

16. The method of claim 14, wherein said non-ferroelectric high-k material layer is deposited on and in direct contact with an exposed semiconductor material at an upper surface of said second fin.

\* \* \* \* \*

UNITED STATES PATENT AND TRADEMARK OFFICE
CERTIFICATE OF CORRECTION

PATENT NO. : 9,449,972 B1  
APPLICATION NO. : 14/640151  
DATED : September 20, 2016  
INVENTOR(S) : Stefan Flachowsky et al.

Page 1 of 1

It is certified that error appears in the above-identified patent and that said Letters Patent is hereby corrected as shown below:

In the Claims
Col. 12, line 3 (claim 2, line 3), change "(ME)" to "(RIE)".

Signed and Sealed this
Fifteenth Day of November, 2016

Michelle K. Lee
*Director of the United States Patent and Trademark Office*